US012191278B2

(12) United States Patent
Hirata et al.

(10) Patent No.: US 12,191,278 B2
(45) Date of Patent: Jan. 7, 2025

(54) METHOD FOR MANUFACTURING ELECTRONIC COMPONENT

(71) Applicants: CONNECTEC AMERICA, INC., San Jose, CA (US); CONNECTEC JAPAN CORPORATION, Myoko (JP)

(72) Inventors: Katsunori Hirata, Myoko (JP); Nozomi Shimoishizaka, Myoko (JP); Takahiro Nakano, Myoko (JP)

(73) Assignees: CONNECTEC AMERICA, INC., San Jose, CA (US); CONNECTEC JAPAN CORPORATION, Niigata (JP)

( * ) Notice: Subject to any disclaimer, the term of this patent is extended or adjusted under 35 U.S.C. 154(b) by 288 days.

(21) Appl. No.: 17/839,182

(22) Filed: Jun. 13, 2022

(65) Prior Publication Data

US 2022/0310558 A1    Sep. 29, 2022

Related U.S. Application Data

(63) Continuation of application No. PCT/JP2020/046409, filed on Dec. 11, 2020.
(Continued)

(51) Int. Cl.
*H01L 23/00* (2006.01)

(52) U.S. Cl.
CPC ............. *H01L 24/92* (2013.01); *H01L 24/11* (2013.01); *H01L 24/27* (2013.01); *H01L 24/81* (2013.01);
(Continued)

(58) Field of Classification Search
CPC ...................................................... H01L 24/11
See application file for complete search history.

(56) References Cited

U.S. PATENT DOCUMENTS

| 5,641,113 A * | 6/1997 | Somaki ................ H05K 3/3436 29/879 |
| 2011/0133137 A1 | 6/2011 | Hirano et al. |
| 2018/0237667 A1 | 8/2018 | Kim et al. |

FOREIGN PATENT DOCUMENTS

| JP | 2007-115904 A | 5/2007 |
| JP | 2011-171720 A | 9/2011 |

(Continued)

OTHER PUBLICATIONS

Patent Cooperation Treaty, International Search Report, Application No. PCT/JP2020/046409, dated Feb. 16, 2021, in 4 pages.

*Primary Examiner* — Mohammad M Choudhry
(74) *Attorney, Agent, or Firm* — PROCOPIO, CORY, HARGREAVES & SAVITCH LLP

(57) ABSTRACT

A manufacturing method comprises preparing a bonding substrate having bumps thereon; preparing a mounted member having external conductive members; applying a fixing material to the surface of the bonding substrate and/or to a surface of the mounted member; and fixing the bonding substrate and the mounted member with the fixing material such that the bumps contact the external conductive members. The fixing material is prepared to contain a first compound and a second compound, each having respective viscosities which change depending on their respective temperature profiles; and applying the fixing material to the bonding substrate and/or the mounted member at a temperature lower than a first temperature, and the fixing comprises pressing the bonding substrate against the mounted member when the fixing material has a temperature lower than the first temperature; and heating the fixing material to a temperature higher than the second temperature and curing the fixed material.

1 Claim, 16 Drawing Sheets

Related U.S. Application Data

(60) Provisional application No. 62/947,832, filed on Dec. 13, 2019.

(52) U.S. Cl.
CPC ...... *H01L 24/83* (2013.01); *H01L 2224/1132* (2013.01); *H01L 2224/2741* (2013.01); *H01L 2224/81201* (2013.01); *H01L 2224/83201* (2013.01); *H01L 2224/9211* (2013.01)

(56) References Cited

FOREIGN PATENT DOCUMENTS

| | | |
|---|---|---|
| JP | 5513417 B | 6/2014 |
| JP | 2019-509620 A | 4/2019 |

* cited by examiner

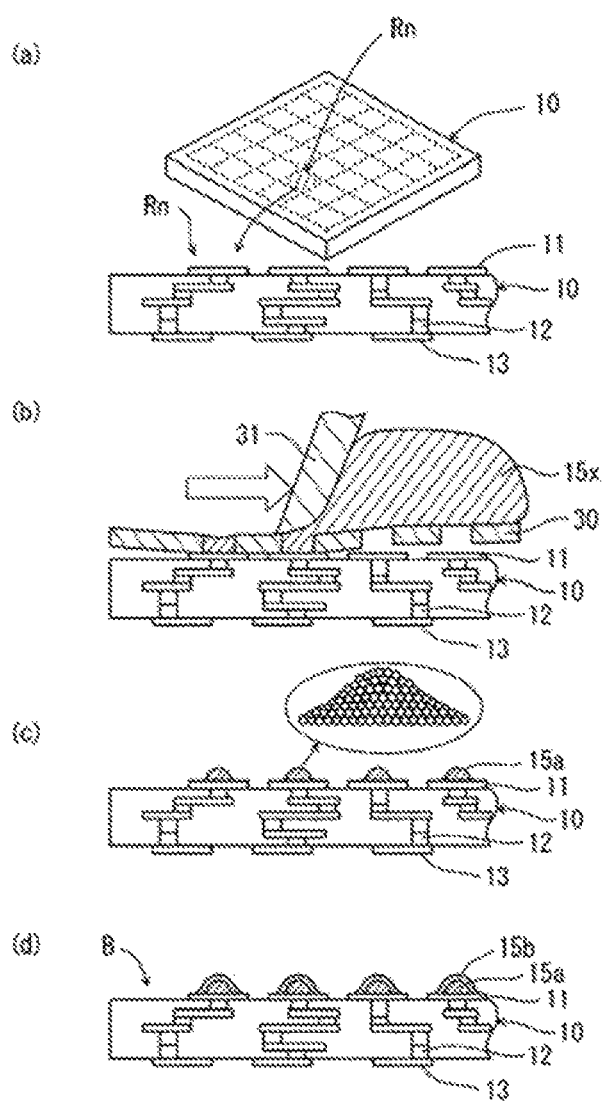
[Fig. 1]

[Fig. 2]
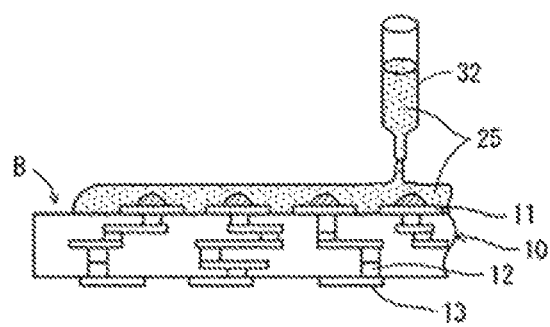
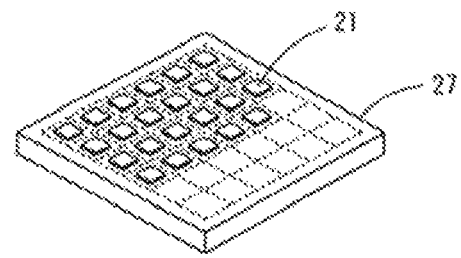
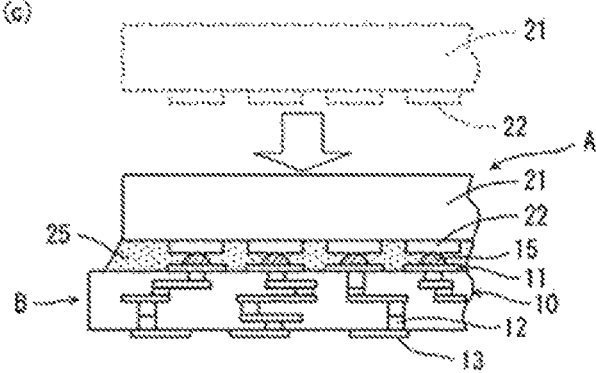

[Fig. 3]
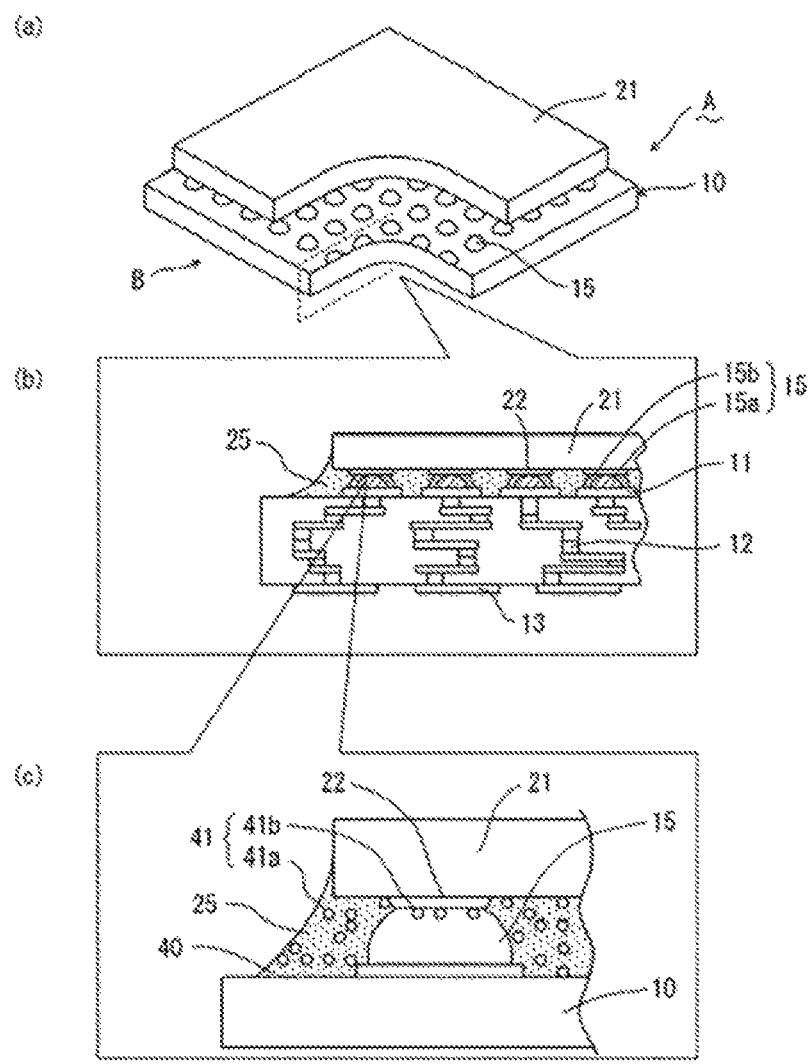

[Fig. 4]
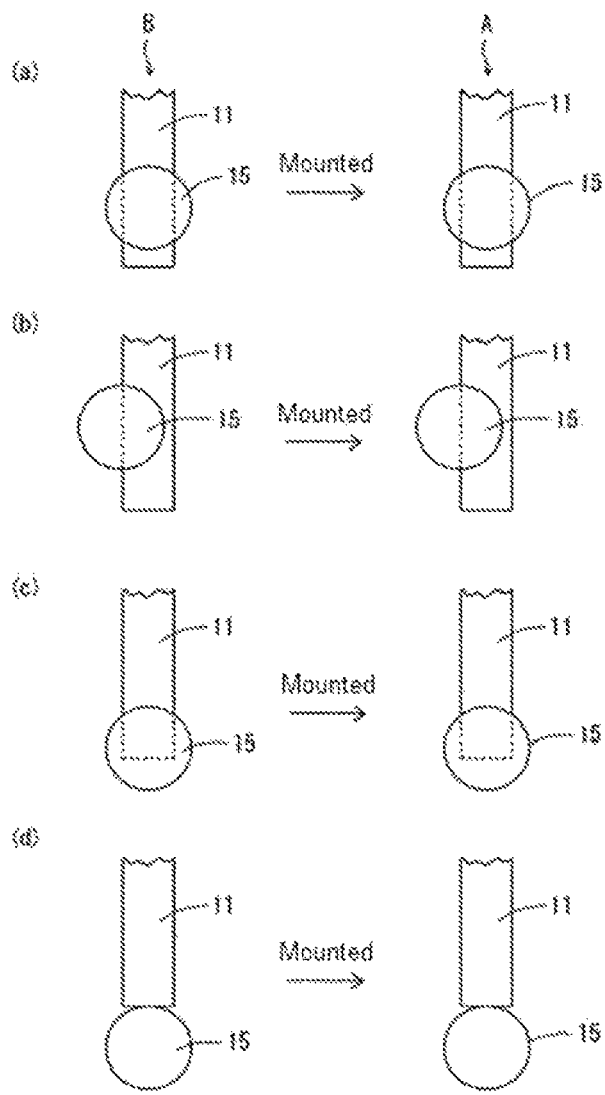

[Fig. 5]
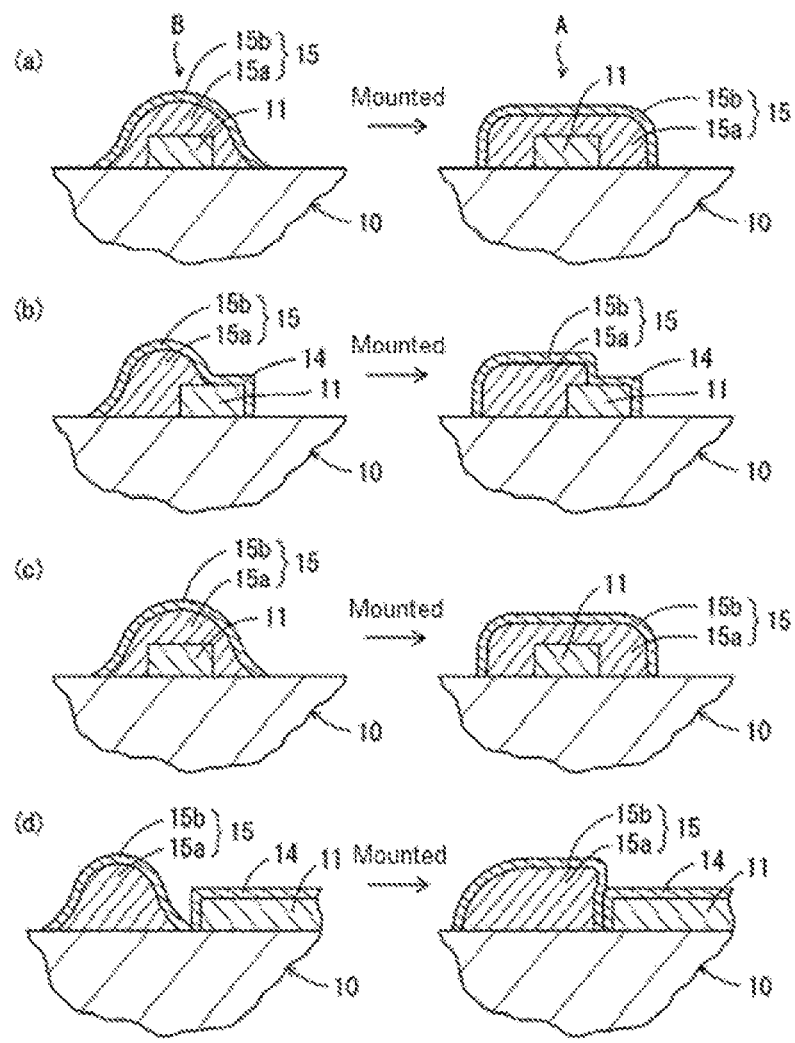

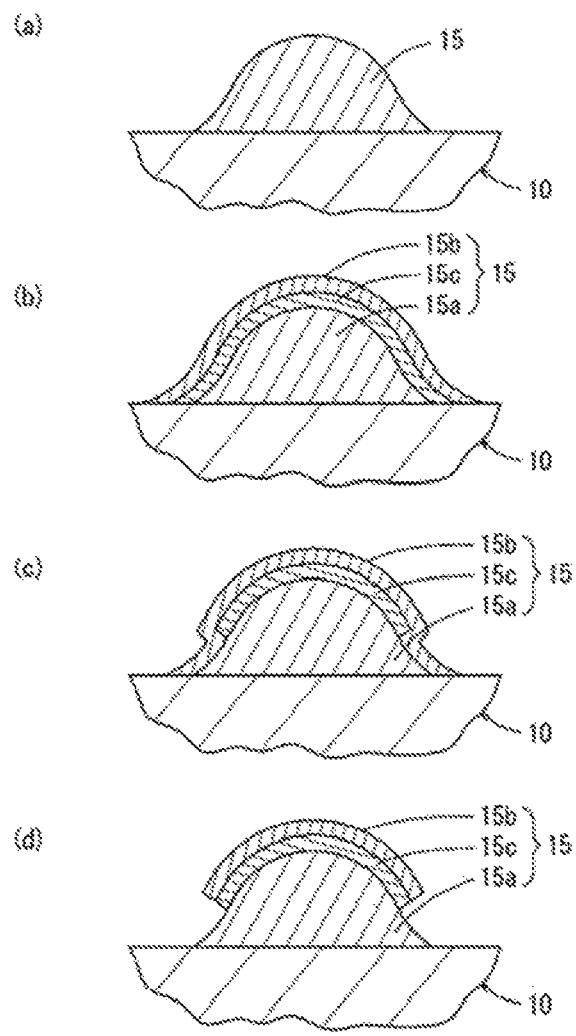
[Fig. 6]

[Fig. 7]
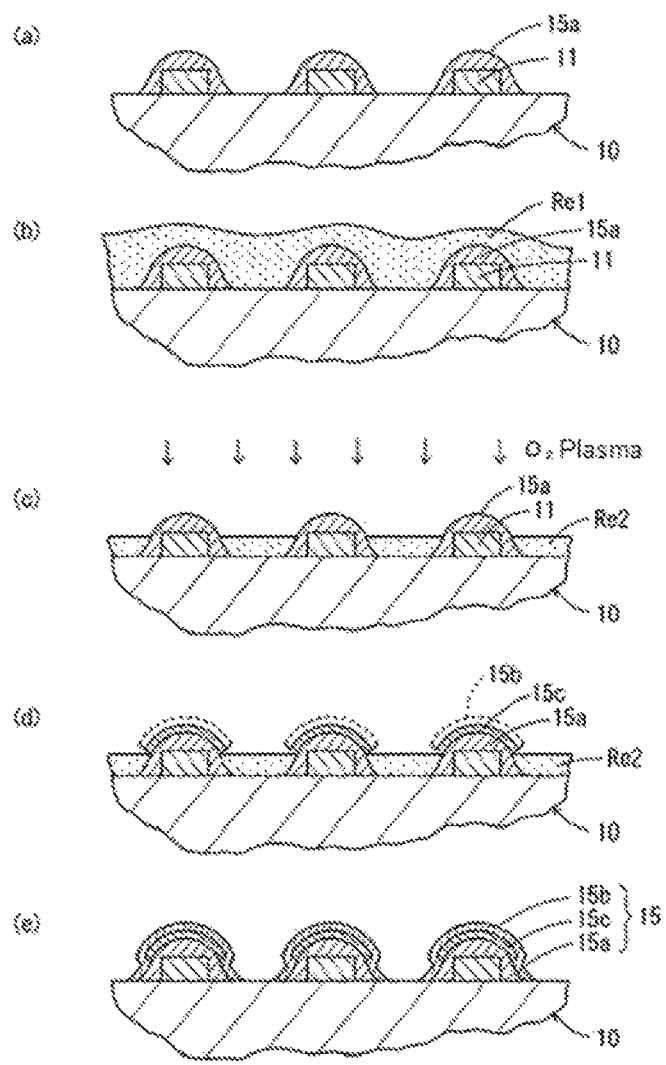

[Fig. 8]
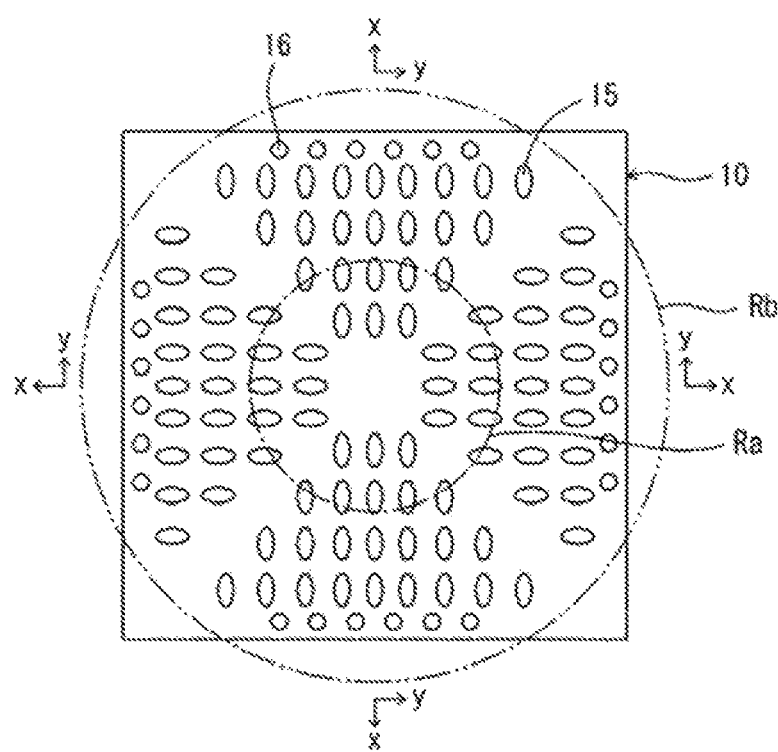

[Fig. 9]
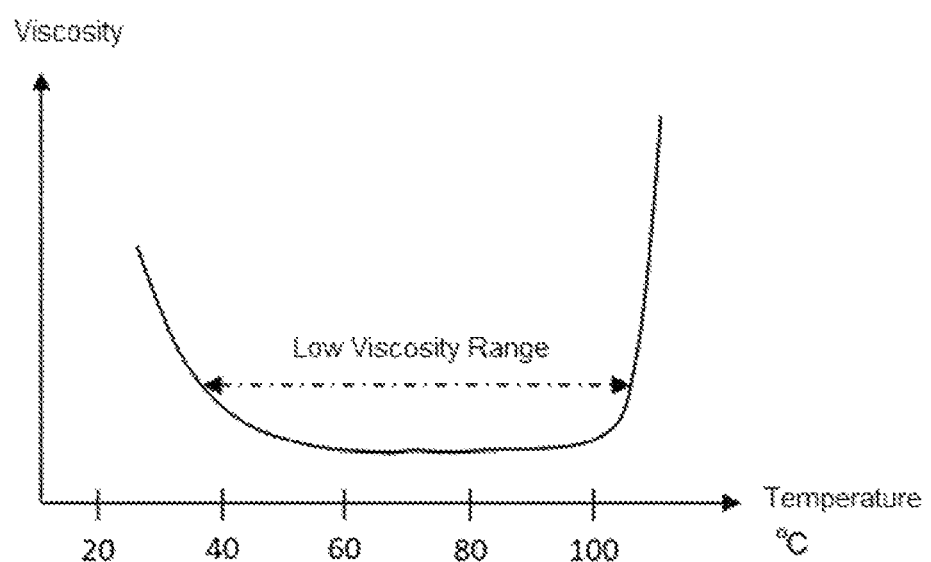

[Fig. 10]
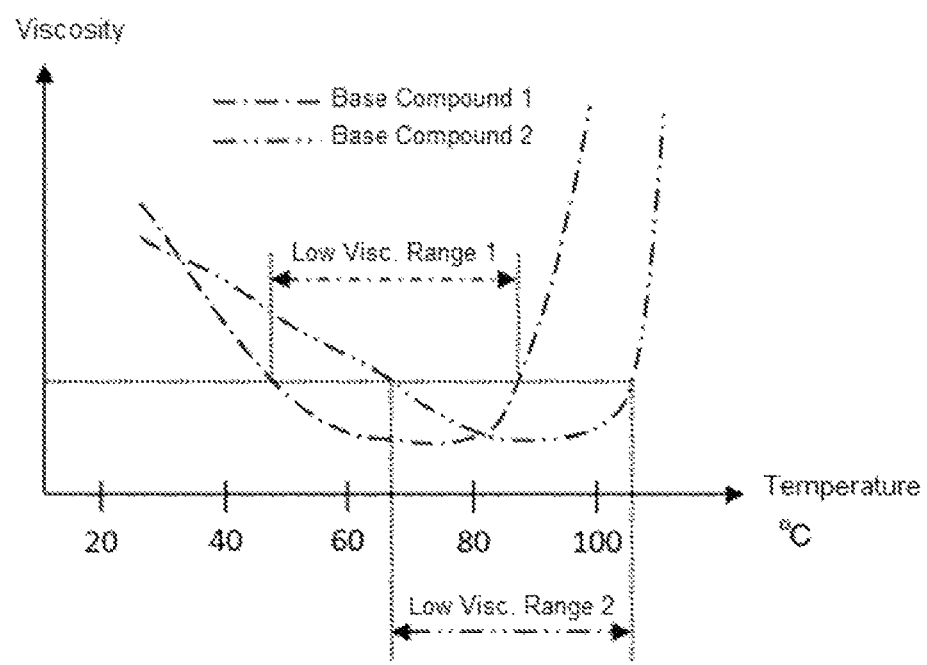

[Fig. 11]
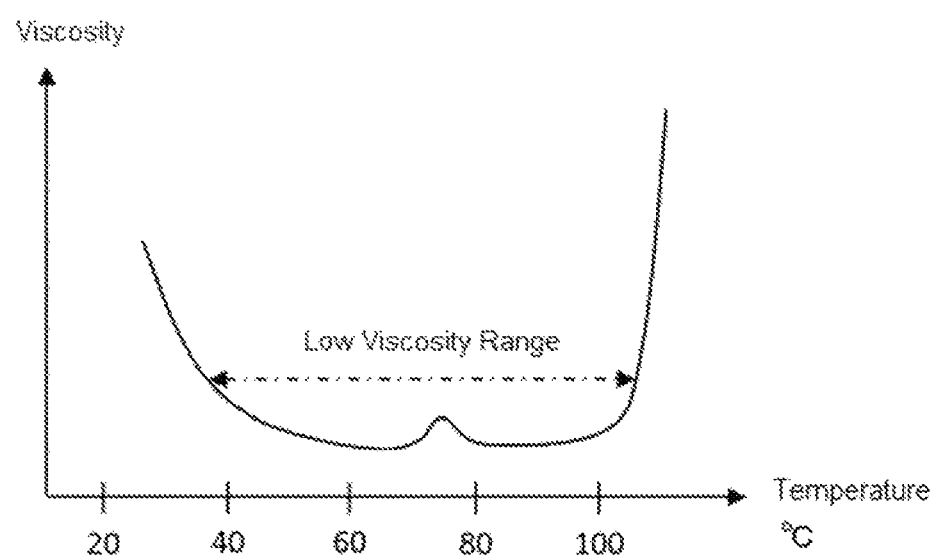

[Fig. 12]
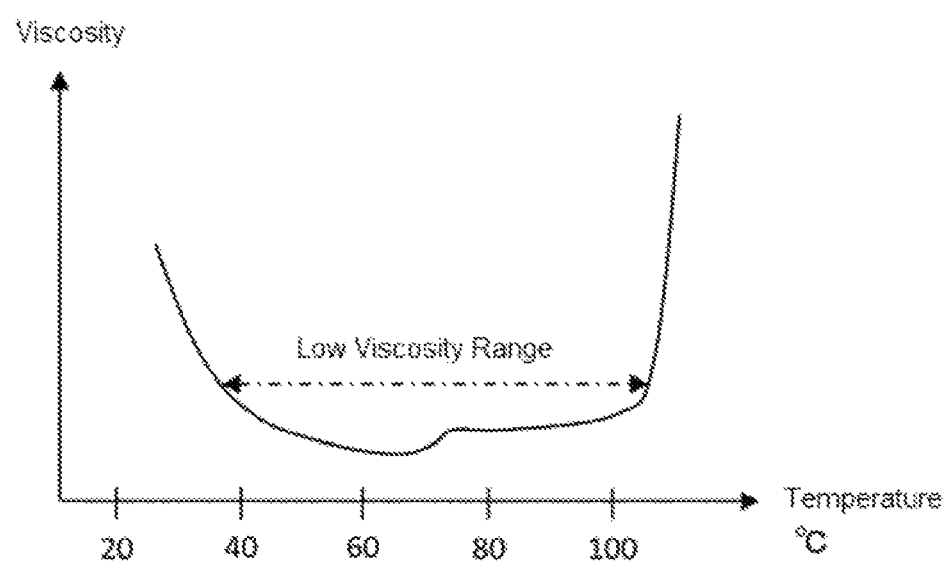

[Fig. 13]
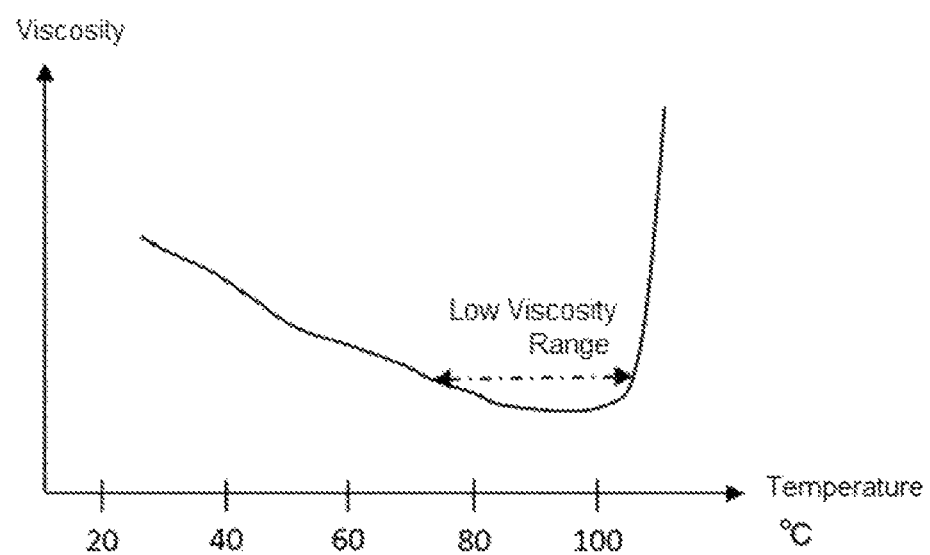

[Fig. 14]
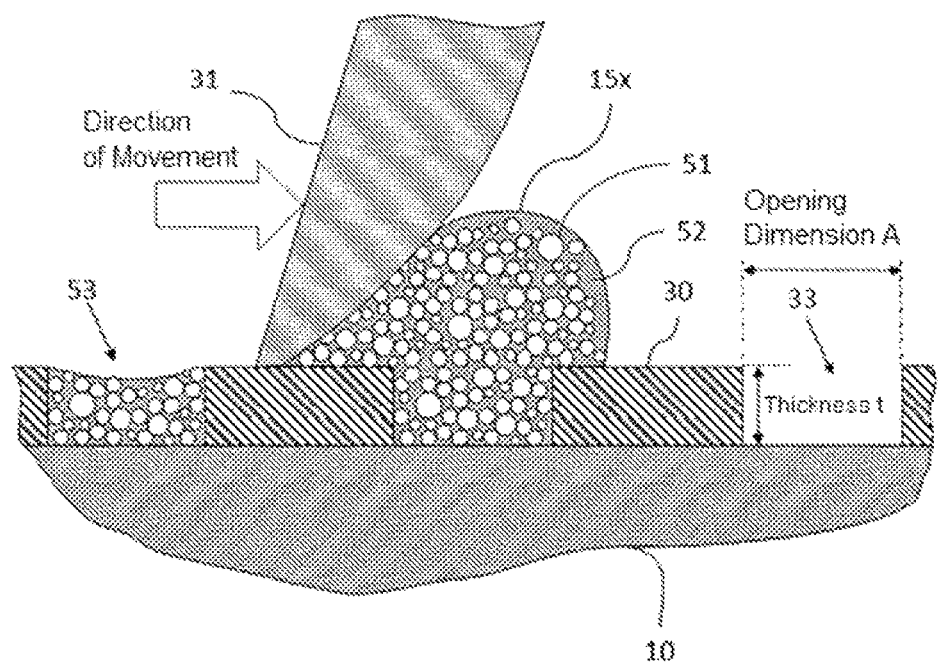

[Fig. 15]
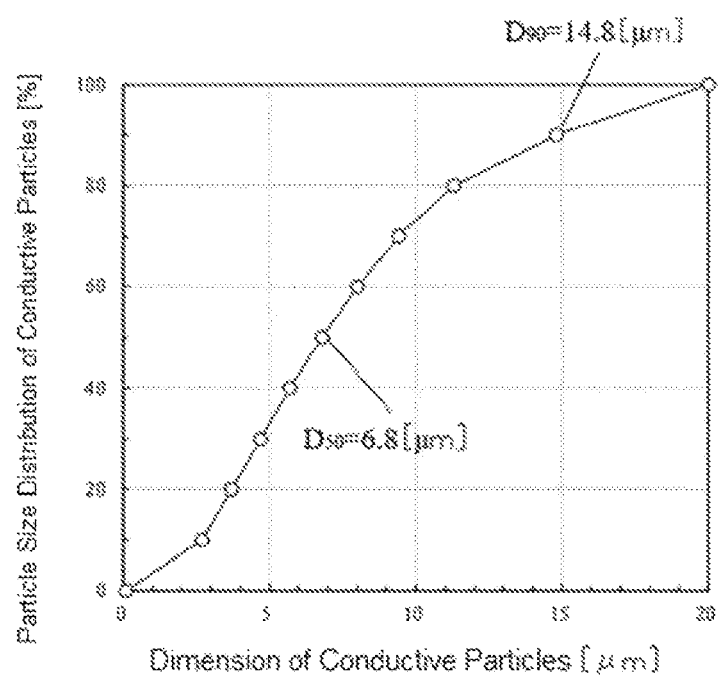

[Fig. 16]
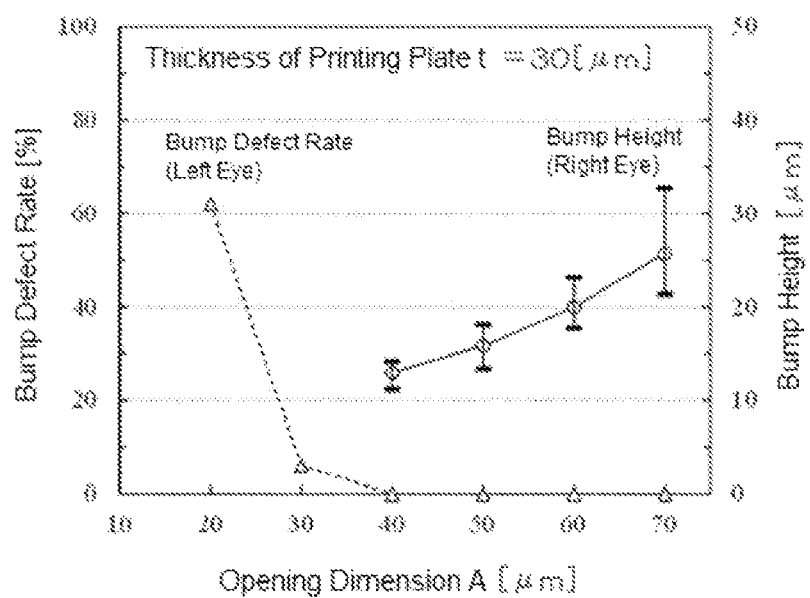

METHOD FOR MANUFACTURING ELECTRONIC COMPONENT

BACKGROUND

The present invention relates to a method for manufacturing electronic components.

RELATED ART

As disclosed in Patent Document 1, a method of forming a bonding substrate provided with bumps and a semiconductor chip provided with external conductive members using a non-conductive adhesive is known.
Patent Document 1: JP 5513417 B2

When a bonding substrate and the semiconductor chip are secured using a non-conductive adhesive in the related art described above, the non-conductive adhesive remains between the bumps and the external conductive members, which impacts the conductivity between the bumps and the external conductive members.

In one embodiment of the present invention, a method for manufacturing electronic components is provided to improve the conductivity between bumps and external conductive members in electronic components obtained by securing a bonding substrate provided with bumps and a semiconductor chip provided with external conductive members using a non-conductive adhesive.

SUMMARY

One embodiment of the present invention is to provide a method for manufacturing an electronic component, the method comprising: a step of preparing a bonding substrate on which a plurality of bumps are provided; a step of preparing a mounted member that has a plurality of external conductive members; a step of applying a fixing material to a surface of the bonding substrate on which the bumps have been formed and/or to a surface of the mounted member on which the external conductive members have been formed; and a step for pressing the bonding substrate against the mounted member such that the bumps and the external conductive members come into contact and fixing the bonding substrate and the mounted member with the fixing material, wherein the step of applying the fixing material comprises: a step of preparing as the fixing material a material containing a first base compound having a characteristic of viscosity which changes depending on the temperature and a second base compound having a characteristic of viscosity which changes depending on the temperature, the first base compound having a first viscosity at a first temperature, the first base compound having the lowest viscosity at the first temperature, the second base compound having a second viscosity at a second temperature higher than the first temperature, the second base compound having the lowest viscosity at the second temperature, and the fixing material having a viscosity higher than the first viscosity and the second viscosity at a third temperature lower than the first temperature, and having a characteristic of being cured at a fourth temperature higher than the second temperature; and a step of applying the fixing material to the bonding substrate and/or the mounted member at a temperature lower than the first temperature, and wherein the fixing step comprises: a step of pressing the bonding substrate against the mounted member when the temperature of the fixing material is lower than the first temperature; and a step of heating the fixing material to a temperature higher than the second temperature to cure the fixed material.

This embodiment of the present invention can reduce the residual amount of non-conductive adhesive between bumps and external conductive members when securing a bonding substrate and a mounted member using a non-conductive adhesive. In this way, an electronic component can be provided that has sufficient conductivity between the bumps and the external conductive members.

BRIEF DESCRIPTION OF DRAWINGS

FIG. 1 (*a*) to FIG. 1 (*d*) are vertical cross-sectional views showing the steps performed to manufacture the bonding substrate in a first embodiment.

FIG. 2 (*a*) to FIG. 2 (*c*) are vertical cross-sectional views showing the steps performed to manufacture the electronic component in the first embodiment.

FIG. 3 (*a*) to FIG. 3 (*c*) are a perspective view and partial vertical cross-sectional views of the electronic component in the first embodiment.

FIG. 4 (*a*) to FIG. 4 (*d*) are top views showing variations in the bump formation positions.

FIG. 5 (*a*) to FIG. 5 (*d*) are vertical cross-sectional views corresponding to FIG. 4 (*a*) to FIG. 4 (*d*).

FIG. 6 (*a*) to FIG. 6 (*d*) are vertical cross-sectional views showing structural examples of bumps.

FIG. 7 (*a*) to FIG. 7 (*e*) are vertical cross-sectional views showing the steps performed to manufacture bumps in a second embodiment.

FIG. 8 is a top view showing the bump pattern in a third embodiment from above.

FIG. 9 is a graph showing an example of the temperature-viscosity characteristics of a non-conductive adhesive 25.

FIG. 10 is a graph showing an example of the temperature-viscosity characteristics of the based compounds in the non-conductive adhesive 25.

FIG. 11 is a graph showing another example of the temperature-viscosity characteristics of a non-conductive adhesive 25.

FIG. 12 is a graph showing another example of the temperature-viscosity characteristics of a non-conductive adhesive 25.

FIG. 13 is a graph showing another example of the temperature-viscosity characteristics of a non-conductive adhesive in a comparative example.

FIG. 14 is a vertical cross-sectional view showing the steps performed to manufacture the bonding substrate in a fourth embodiment.

FIG. 15 is a graph showing an example of the particle size distribution of the conductive particles 15 in a printing ink 15*x*.

FIG. 16 is a graph showing the relationship between the size of the openings 33 in a stencil 30 and the bump failure rate (non-conductivity rate) and bump height.

DETAILED DESCRIPTION

FIG. 1 (*a*) to FIG. 1 (*d*) are vertical cross-sectional views showing the steps performed to manufacture the bonding substrate B in a first embodiment. FIG. 2 (*a*) to FIG. 2 (*c*) are vertical cross-sectional views showing the steps performed to manufacture the electronic component A in the first embodiment. FIG. 3 shows a perspective view and partial vertical cross-sectional views of the electronic component A in the first embodiment.

The structures and manufacturing steps for the bonding substrate B and the electronic component A in the present embodiment will now be described with reference to FIG. 1 to FIG. 3.

Manufacture of Bonding Substrate and Manufacturing Steps

First, a ceramic substrate 10 is prepared as the substrate in the step shown in FIG. 1 (a). Wiring 11 made of a conductive material is formed on the upper surface of the ceramic substrate 10. The ceramic substrate 10 is a well-known multilayer board in which a large number of vias (plugs) 12 and wiring 11 are laminated via insulating film, and a back side electrode 13 is provided on the back surface of the ceramic substrate 10. The ceramic substrate 10 is provided with a large number of partial regions Rn on a grid pattern, and each partial region Rn is used to mount a mounted member such as a semiconductor chip. FIG. 1 (a) to FIG. 1 (d) show the vertical cross-sectional structure of a portion of each partial region Rn.

The substrate is not limited to a ceramic substrate. A rigid wiring board or a flexible board using inorganic material other than a ceramic material or an organic resin may be used. The wiring board is also not limited to a multilayer wiring board, and may be a wiring board with a single layer of wiring.

In the present embodiment, the wiring 11 is arranged at a pitch of about 70 μm. The width of the wiring 11 is about 30 to 40 μm, and the thickness is about 5 to 10 μm.

The material used in the wiring 11 can be, for example, Cu, a Cu alloy, Al, an Al alloy, W, a W alloy, Mo, and/or a Mo alloy.

Next, in the step shown in FIG. 1 (b), the stencil 30 with openings for transferring ink is placed on the ceramic substrate 10, and a paste-like printing ink 15x is applied to the top of the stencil. A squeegee 31 is moved over the stencil 30 to transfer the printing ink 15x to the ceramic substrate 10 from the openings in the stencil 30. A conductive paste such as Ag paste (silver paste) is generally used as the printing ink 15x, but a non-conductive paste such as a resin ink may also be used.

As shown in FIG. 1 (c), the transferred printing ink 15x forms mound-shaped bump core portions 15a. In the present example, the bump core portions 15a are only in contact with the wiring 11, but as will be described later, the bump core portions 15a are preferably also in contact with the ceramic substrate 10. A printing ink 15x made of Ag paste is mainly composed of highly conductive silver filler and a resin binder.

The curing temperature of the resin binder can be, for example, from about 100 to 200° C.

Next, the Ag paste is cured in this state. At this time, the bump core portions 15a have a structure in which Ag particles are piled up in a mound shape as shown in the partially enlarged view. The bump core portions 15a, the wiring 11, and the ceramic substrate 10 are securely bonded to each other in the curing process.

In the step shown in FIG. 1 (c), the bump core portions 15a may be pre-cured. In this way, the bump core portions 15 can be cured in their entirety during the step of curing the adhesive used in the chip mounting step described below. In the present embodiment, an epoxy resin is used as the adhesive as described below. When this step is performed, a resin binder that can be cured at a temperature lower than the thermosetting temperature of the epoxy resin may be used in the printing ink.

Further, instead of the resin binder, an inorganic binder (or a mixture of an inorganic binder and a resin binder) such as a glass frit that is fired at a relatively high temperature (for example, 500° C. or higher) may be used. In this case, the bump core portions 15a and the ceramic substrate 10 can be subjected to metallized joining. In this case, the bump core portions 15a can be plastically deformed by selecting the proper composition for the inorganic binder (or mixture of an inorganic binder and a resin binder).

As shown in the enlarged view in FIG. 1 (c), the bump core portions 15a formed by printing Ag paste have a highly uneven surface due to the Ag particles. As a result, adhesiveness to the adhesive remains high during mounting.

Next, in the step shown in FIG. 1 (d), a bump film 15b consisting of a plating layer is formed. Electroplating or electroless plating can be used to form the bump film 15b. The plating layer can be, for example, Ni/Au layers, Ni/Pd/Au layers, or a single Au layer. In the present embodiment, the single Au layer is used. Although not shown in FIG. 1 (d), a plating layer 14 (see FIG. 5 (b)) is also formed on the surface of the wiring 11 at this time.

A bump core portion 15a and a bump film 15b form a bump 15 for electrically connecting an external conductive member on a mounted member to a conductive member (wiring 11).

By performing the steps shown in FIG. 1 (a) to FIG. 1 (d), a bonding substrate B is formed that is composed of a substrate (ceramic substrate 10) containing a conductive member (wiring 11) on the upper surface and bumps 15 formed on top of the substrate.

Manufacture of Electronic Component and Manufacturing Steps

Next, in the step shown in FIG. 2 (a), a non-conductive adhesive (NCP) 25 serving as the securing material is applied from a container 32 to the upper surface of the bonding substrate B. The non-conductive adhesive may be any adhesive that exhibits a strong bonding force during curing. Examples include epoxy resins, polyimide resins, and modified polyimide resins.

Next, in the step shown in FIG. 2 (b), a chip tray 27 is prepared in which a large number of semiconductor chips 21 (mounted members) have been placed.

Next, in the step shown in FIG. 2 (c), a bonding substrate B is placed on a support base (not shown), a semiconductor chip 21 taken from the chip tray 27 is mounted in a partial region Rn of the bonding substrate B, and the back side electrode 22 (external conductive member) of the semiconductor chip 21 and bumps 15 on the bonding substrate B are aligned with each other. The non-conductive adhesive 25 is then cured while pressing the semiconductor chip 21 down with a pressing member (not shown).

FIG. 9 is a graph showing an example of the temperature-viscosity characteristics of the non-conductive adhesive 25. First, as shown in FIG. 9, the viscosity of the non-conductive adhesive 25 gradually decreases as the temperature rises, and then exhibits a certain viscosity within a predetermined temperature range. When a certain temperature is exceeded, the adhesive is cured.

In the step shown in FIG. 2 (a), the non-conductive adhesive 25 is applied at a temperature of, for example, room temperature (about 25° C.). The non-conductive adhesive 25 is viscous enough to fill the space between the wiring 11 and the bumps on the surface of the bonding substrate B at these temperatures while also covering the surface of the bumps 15. The non-conductive adhesive 25 is also viscous enough to remain outside the peripheral region of the bonding substrate B, or the region in which the non-conductive adhesive 25 is not present in FIG. 2 (a).

In the securing step shown in FIG. 2 (c), the non-conductive adhesive 25 bonds the electronic component A and the bonding substrate B via the non-conductive adhesive 25 at a temperature of, for example, room temperature. With the electronic component A and the bonding substrate B bonded to each other, the non-conductive adhesive 25 is heated while the back side electrode 22 of the semiconductor chip 21 (electronic component A) is pressed against the bumps 15.

When the non-conductive adhesive 25 is applied to the bonding substrate B and then heated to raise its temperature, its viscosity gradually decreases as shown in FIG. 9. The non-conductive adhesive 25 has a low viscosity range in which its viscosity remains substantially constant when the temperature is increased in a certain temperature range. The viscosity is so low that the non-conductive adhesive between the back side electrode 22 and the bumps 15 spreads around the back side electrode 22 and the bumps 15. In other words, the non-conductive adhesive 25 has a low viscosity in this range while it is being heated and its temperature rises, and it spreads from between the back side electrode 22 and the bumps 15 in this low viscosity range. In this way, as shown in FIG. 3 (c), the back side electrodes 22 and the bumps 15 are joined so that there is sufficient conductivity between the back side electrodes 22 and the bumps 15.

As shown in FIG. 9, the non-conductive adhesive 25 in the present embodiment has temperature characteristics with a wide low viscosity range. In other words, in the manufacturing method according to the present embodiment, the non-conductive adhesive 25 can remain in a low viscosity state for a long period of time while the applied non-conductive adhesive 25 is being heated and cured. As a result, the non-conductive adhesive 25 sufficiently spreads from between the back side electrodes 22 and the bumps 15, so that sufficient conductivity can be maintained between the back side electrodes 22 and the bumps 15.

FIG. 10 is a graph showing an example of the temperature-viscosity characteristics of the based compounds in the non-conductive adhesive 25. The non-conductive adhesive 25 in the present embodiment is composed of a first base compound and a second base compound which have different temperature-viscosity characteristics. The first base compound and second base compound can be, for example, an epoxy resin such as bisphenol F-type epoxy resin, an epoxy resin such as bisphenol A-type epoxy resin, a cresol novolac-type epoxy resin, a phenol novolac-type epoxy resin, or a dicyclopentadiene (DCPD)-type epoxy resin. In the present embodiment, two of these epoxy resins with different molecular skeletons and molecular weights, different melting or softening temperatures, and different gelling or curing temperatures, that is, different temperature ranges in which the viscosity decreases, are selected as the base compounds. The first base compound has a first low viscosity range or temperature range in which the viscosity is 5 Pa·s or less. The second base compound has a second low viscosity range or temperature range in which the viscosity is 5 Pa·s or less. The lower limit of the second low viscosity range is higher than the lower limit of the first low viscosity range, and the upper limit of the former is higher than the upper limit of the first low viscosity range. The first low viscosity range 1 is a range of about 50° C. to about 90° C., and the second low viscosity range 2 is a range of about 70° C. to about 110° C. In other words, in the present embodiment, the first low viscosity range and the second low viscosity range have overlapping temperature ranges. The temperature at which the viscosity of the second base compound is at its lowest is higher than the temperature at which the viscosity of the first base compound is at its lowest. In the present embodiment, the temperature at which the viscosity of the first base compound is at its lowest is about 80° C., and the temperature at which the viscosity of the second base compound is at its lowest is about 100° C.

In the present embodiment, the non-conductive adhesive 25 contains two base compounds, but may also contain three or more base compounds. In addition to base compounds, a non-conductive adhesive 25 may contain an inhibitor that suppresses an increase or decrease in the viscosity or curing or an accelerator that promotes an increase or decrease in viscosity or curing of at least one of the base compounds. A non-conductive adhesive 25 may contain both an inhibitor and an accelerator.

FIG. 11 and FIG. 12 are graphs showing other examples of the temperature-viscosity characteristics of non-conductive adhesives 25. As shown in FIG. 11, a non-conductive adhesive 25 may have properties in which the viscosity increases in a portion of the low viscosity range, and then decreases as the temperature increases. For example, in a non-conductive adhesive 25, there is little or no region in which the low viscosity range of the first base compound and the low viscosity range of the second base compound 2 overlap. As shown in FIG. 12, a non-conductive adhesive may have properties in which the viscosity increases in a portion of the low viscosity range, and then remains substantially constant. As mentioned above, the non-conductive adhesive 25 does not have to have a substantially constant viscosity over the entire low viscosity range in which the viscosity is equal to or lower than a predetermined viscosity.

FIG. 13 is a graph showing another example of the temperature-viscosity characteristics of a non-conductive adhesive in a comparative example. In the comparative example, the non-conductive adhesive contains a single base compound. Although the non-conductive adhesive in the comparative example has properties in which the viscosity decreases as the temperature rises and then increases leading to curing, the low viscosity range is narrower than the low viscosity range of the non-conductive adhesives 25 in the present embodiment. In other words, in the comparative example, during the step of heating the non-conductive adhesive to secure the mounting substrate and the semiconductor chip, the time during which the non-conductive adhesive has sufficiently low viscosity is shortened. As a result, in the comparative example, the non-conductive adhesive between back side electrodes and bumps may not spread sufficiently. When the conductivity between the back side electrodes and bump was measured in an electronic component created using the non-conductive adhesive in the comparative example and an electronic component created using a non-conductive adhesive 25 of the present embodiment, the conductivity in the comparative example was about 50%, whereas the conductivity in the present embodiment was almost 100%. This confirmed that the manufacturing method in the present embodiment has a remarkable effect.

When the non-conductive adhesive 25 is cured, the heat shrinkage force of the non-conductive adhesive 25 causes the bumps 15 to become plastically deformed and this flattens the mound-shaped tops of the bumps (see, for example, FIG. 5 (a)). The thickness of the bumps 15 is then 90% or less of the pre-mounting thickness. As shown in FIG. 3 (a) and FIG. 3 (b), the bumps 15 cause the wiring 11 (conductive member) in the bonding substrate B and the back side electrodes 22 (external conductive members) of the semiconductor chips 21 (mounted members) to become electrically connected to each other.

It should be noted that the bumps do not have to become plastically deformed, and may simply become elastically deformed. However, in order to obtain a significant amount of deformation, plastic deformation is preferred.

In this way, an electronic component A with a mounted semiconductor chip 21 (mounted member) is formed on the bonding substrate B.

In the cross section shown in FIG. 2 (c), the bump core portions 15a are only in contact with the wiring 11, but as will be described later, the bump core portions 15a are preferably also in contact with the ceramic substrate 10.

As shown in FIG. 3 (c), a specific filler 41 may be added to the non-conductive adhesive 25 (securing material), and the non-conductive adhesive 25 may be composed of a base compound 40 and a specific filler 41 containing a plurality of particles. However, the base compound 40 does not have to consist simply of a resin. It generally contains various additives. The specific filler 41 brings the coefficient of thermal expansion of the non-conductive adhesive 25 closer to the coefficient of thermal expansion of the bonding substrate B (mainly the ceramic substrate 10) and the semiconductor chip 21, and reduces the thermal stress between the non-conductive adhesive 25 and the bonding substrate B, and between the non-conductive adhesive 25 and the semiconductor chip 21. In this way, the reliability of the electrical connection between the bonding substrate B and a semiconductor chip 25 (mounted member) can be improved.

Typical examples of materials in the specific filler 41 as mentioned above include insulating materials such as $SiO_2$, $ZrO_2$, SiC, and $Al_2O_3$. A semiconducting material such as Si, Ge, or GaN may also be used. Even though the securing material is a non-conductive adhesive, a small amount of metal material such as W, Mo, Cu, Al or an alloy thereof can be used as long as the insulating properties of the non-conductive adhesive 25 can be maintained.

By adding a specific filler 41, the coefficient of thermal expansion of the non-conductive adhesive 25 can be adjusted as follows.

In the present embodiment, the coefficient of thermal expansion of the bonding substrate B is essentially the same as the coefficient of thermal expansion of the ceramic substrate 10. For example, when the ceramic substrate 10 is an alumina board, its coefficient of thermal expansion is about $7 \times 10^{-6}$/K, and when the semiconductor chip 21 has a silicon substrate, its coefficient of thermal expansion is about $3 \times 10^{-6}$/K. The coefficient of thermal expansion of an epoxy resin is about $62 \times 10^{-6}$/K, the coefficient of thermal expansion of a polyimide resin is about $54 \times 10^{-6}$/K, and the coefficient of thermal expansion of a modified polyimide resin is about $20\text{-}60 \times 10^{-6}$/K.

Meanwhile, the coefficient of thermal expansion of $SiO_2$ is about $3 \times 10^{-6}$/K, the coefficient of thermal expansion of $ZrO_2$ is about $8 \times 10^{-6}$/K, the coefficient of thermal expansion of SiC is about $4 \times 10^{-6}$/K. and the coefficient of expansion of $Al_2O_3$ is about $7.0 \times 10^{-6}$/K. In other words, all of them have a coefficient of thermal expansion that is nearly an order of magnitude lower than the coefficient of thermal expansions of the resin materials.

The coefficient of thermal expansion of Cu is about $17 \times 10^{-6}$/K and the coefficient of thermal expansion of Al is about $21 \times 10^{-6}$/K. Both are relatively high, so their function in reducing the coefficient of thermal expansion of a non-conductive adhesive is weak. Meanwhile, the coefficient of thermal expansion of W is about $4.5 \times 10^{-6}$/K and the coefficient of thermal expansion of Mo is about $5.1 \times 10^{-6}$/K. Both are nearly as low as that of an insulating material, so they can sufficiently realize the function of adjusting the coefficient of thermal expansion.

Therefore, by mixing a specific filler 41 with the base compound 40, the coefficient of thermal expansion of the non-conductive adhesive 25 (securing material) can be brought closer to the coefficient of thermal expansion of the semiconductor chip 21 (mounted member) and the bonding substrate B. The coefficient of thermal expansion of the non-conductive adhesive 25 can be adjusted to the desired range by changing the mixing ratio of the specific filler 41 relative to the base compound 40 based on the materials in the specific filler 41.

As shown in FIG. 2 (a) to FIG. 2 (c), when the non-conductive adhesive 25 is applied to the bonding substrate B and a semiconductor chip 21 is mounted on the bonding substrate B, some of the specific filler 41b is interposed between bumps 15 and the back side electrodes 22 of the semiconductor chip 21 as shown in FIG. 3 (c).

The hardness of the cured bumps 15 is preferably adjusted so that they are harder than the base compound 40 in the non-conductive adhesive 25 and softer than the specific filler 41. When the bump core portions 15a are pre-cured in the step shown in FIG. 1 (c), the hardness of the pre-cured bumps 15 is preferably harder than that of the base compound 40 in the non-conductive adhesive 25 and softer than that of the specific filler 41. In order to achieve this hardness, the proper temperature and time may be selected for the curing process. The pre-cured bumps 15 may be harder than the specific filler 41 after the final curing process.

Here, the "hardness" of the bumps means the resistance to plastic deformation when the printing ink constituting the bumps has solidified. A Vickers hardness tester or durometer can be used to evaluate the hardness.

As shown in FIG. 3 (c), some of the specific filler 41b is pushed into the bump 15 while also making contact with the back side electrode 22. At this time, the base compound 40 in the non-conductive adhesive 25 is almost entirely to the outside in the boundary region between the bump 15 and the back side electrode 22 except for near the base of the bump 15. Therefore, the bump 15 and the back side electrode 22 are in stable electrical contact with each other in a region other than where the specific filler 41b is interposed. As a result, the reliability of the electrical connection between the bonding substrate B and the semiconductor chip 21 (mounted member) is improved.

When the specific filler 41 is used in the form of conductive particles such as W or Mo particles, the bumps 25 and the back side electrodes 22 are rendered conductive by some of the specific filler 41b while maintaining insulating properties in the outer portions of the non-conductive adhesive 25. This improves the reliability of the electrical connection.

Alternative Example of Bump Forming Positions

In the embodiment described above, the bumps 15 are formed only on the wiring 11 in the bonding substrate B. However, in the present embodiment, the bumps can be formed at various positions.

FIG. 4 (a) to FIG. 4 (d) are top views showing variations in the formation positions of the bump 15. FIG. 5 (a) to FIG. 5 (d) are vertical cross-sectional views corresponding to FIG. 4 (a) to FIG. 4 (d). In FIG. 4 (a) to FIG. 4 (d) and FIG. 5 (a) to FIG. 5 (d), the left shows their state on the bonding substrate, and the right shows their state on the electronic component A after mounting of a semiconductor chip 21.

FIG. 4 (a) and FIG. 5 (a) show a situation in which a bump 15 is formed to straddle the wiring 11 and the region of the ceramic substrate 10 on both sides of the wiring in the bonding substrate B. While not shown in the cross-sectional view in FIG. 5 (*a*), a plating layer continuous with the bump film 15*b* is formed on the surface of the wiring 11 in another cross section. After mounting a semiconductor chip 21, the bump 15 is pressed against by the back side electrode 22 (not shown) on the semiconductor chip 21 and plastically deformed, flattening its top portion (and central portion) as shown in FIG. 5 (*a*).

FIG. 4 (*b*) and FIG. 5 (*b*) show a situation in which a bump 15 is formed so as to straddle the wiring 11 and the region of the ceramic substrate 10 on both sides of the wiring in the bonding substrate B. As shown in FIG. 5 (*b*), a plating layer 14 is formed on the surface of the wiring 11, and the bump film 15*b* and the plating layer 14 on the wiring 11 form a continuous film. After mounting a semiconductor chip 21, the bump is pressed against by the back side electrode 22 (not shown) on the semiconductor chip 21 and plastically deformed, flattening its top portion as shown in FIG. 5 (*b*).

FIG. 4 (*c*) and FIG. 5 (*c*) show a situation in which a bump 15 is formed on the bonding substrate B so as to straddle the tip of the wiring 11 and the region of the ceramic substrate 10 adjacent to the tip. The cross section orthogonal to the cross section shown here has the shapes shown in FIG. 4 (*b*) and FIG. 5 (*b*).

In this situation as well, after mounting a semiconductor chip 21, the bump 15 is pressed against by the back side electrode 22 (not shown) on the semiconductor chip 21 and plastically deformed, so that its top portion is flattened. A plating layer 14 is also formed on the surface of the wiring 11, and the bump film 15*b* and the plating layer 14 of the wiring 11 form a continuous film.

FIG. 4 (*d*) and FIG. 5 (*d*) show a situation in which the bump 15 is formed on the bonding substrate B only in the region of the ceramic substrate 10 adjacent to the wiring 11. The cross section shown here is the cross section orthogonal to the cross sections shown in FIG. 4 (*a*) to FIG. 4 (*c*) and FIG. 5 (*a*) to FIG. 5 (*c*).

In this situation as well, after mounting a semiconductor chip 21, the bump 15 is pressed against by the back side electrode 22 (not shown) on the semiconductor chip 21 and plastically deformed, so that its top portion is flattened. The plating layer 14 is also formed on the surface of the wiring 11. Because the plastically deformed bump film 15*b* and the plating layer 14 on the wiring 11 are in contact with each other, the bump 15 and the wiring 11 are rendered conductive after mounting.

In the modified examples shown in FIG. 4 (*a*) to FIG. 4 (*c*) and FIG. 5 (*a*) to FIG. 5 (*c*), the bumps 15 straddle the surfaces of the wiring 11 and the ceramic substrate 10. Therefore, because the bumps 15 adhere not only to the wiring 11 but also to the ceramic substrate 10, the adhesion between the wiring 11 and the ceramic substrate (base material) is strengthened.

Bump Manufacturing Example

In the embodiment described above, the bumps 15 are composed of a bump core portion 15*a* and a bump film 15*b*. However, the structure of the bumps 15 in the present embodiment is not limited to this example.

FIG. 6 (*a*) to FIG. 6 (*d*) are vertical cross-sectional views showing structural examples of bumps.

In the structure shown in FIG. 6 (*a*), bumps 15 are composed of a single Ag layer formed by printing. Here, the step of plating the surface of the bump 15 is unnecessary and Au is not used, so manufacturing costs can be reduced. The plastic deformation of bumps 15 during the mounting process is also easier.

In the structure shown in FIG. 6 (*b*), an intermediate plating layer 15*c* is interposed between the bump core portion 15*a* and the bump film 15*b*. Here, for example, a Ni plating layer can be formed as the intermediate plating layer 15*c*, and an Au plating layer can be formed as the bump film 15*b*. In other words, the plating layer can be a Ni/Au layer. This intermediate plating layer 15*c* is able to improve adhesion between the bump core portion 15*a* and the bump film 15*b*, and reduce the Au plating thickness to save on manufacturing costs.

The intermediate plating layer 15*c* can be composed of a plurality of plating layers, for example, a Ni/Pd layer.

In the structure shown in FIG. 6 (*c*), the intermediate plating layer 15*c* is interposed between the bump core portion 15*a* and the bump film 15*b* only in the top portion. Here, for example, a Ni plating layer can be formed as the intermediate plating layer 15*c*, and an Au plating layer can be formed as the bump film 15*b*. Because the Ni plating layer is hard, deformation of the entire bump 15 may be hampered, but plastic deformation is easy in the region where the Ni plating layer does not exist in the structure shown in FIG. 6 (*c*). Therefore, the intermediate plating layer 15*c* makes mounting easier while ensuring sufficient adhesion between the bump core portion 15*a* and the bump film 15*b*.

In the structure shown in FIG. 6 (*d*), the bump film 15*b* and the intermediate plating layer 15*c* are formed only in the top portion of the bump core portion 15*a*. In this structure, plastic deformation of the entire bump 15 is easier than with the structure shown in FIG. 15 (*c*).

A second embodiment of the manufacturing process for the structures shown in FIG. 6 (*c*) and FIG. 6 (*d*) will now be described.

The following operations effects can be obtained from the bonding substrate B and the electronic component in the present embodiment.

Because at least the bump core portion 15*a* of the bump 15 is formed by printing, a bump 15 can be obtained with a thick film, which is difficult to obtain by plating. Therefore, even though the heights of substrates and conductive members vary widely, a highly reliably electrical connection can be maintained between the wiring 11 (conductive member) and back side electrodes 22 (external conductive members) of the semiconductor chip 21 (mounted member) via the bumps 15. In other words, a high degree of reliability can be maintained in the electrical connection between a bonding substrate B and mounted members.

As described later, when a ceramic substrate 10 is used, the variation in height between the conductive members (wiring 11, etc.) in each partial region Rn can be about 10 μm or more when warping and dimensional errors in the conductive member from the time of formation are taken into account. However, in the protruding electrodes formed by electrolytic plating in Patent Document 1, the thickness is actually 5 to 8 μm due to the resist film thickness and limitations on plating time, and highly reliable electrical connections between the conductive members and the external conductive members of the mounted members cannot be maintained. Also, because the protruding electrodes in Patent Document 1 are formed using the wiring surface as the reference surface, variations in the height of the board surface due to warping of the board are added to the variations in wiring thickness, so variations in the height of the protruding electrodes are significant.

In contrast, the thickness at the top of a bump core portion 15*a* formed by printing can be increased to about 20 to 50 μm. Therefore, even when the heights of the conductive members vary widely, the reliability of the electrical connection between the conductive member and the external conductive members of the mounted members can be maintained. Also, because the bump core portion 15a formed by printing in the present embodiment is formed with the substrate surface serving as the reference surface, variations in a conductive member such as wiring can be ignored.

In the embodiment described above, a ceramic substrate is used as the substrate, but the substrate in the present embodiment can be an inorganic substrate other than a ceramic substrate such as a glass board or an organic board made of polyimide, PET, or PEI.

However, using an inorganic substrate such as a ceramic substrate rather than an organic substrate as the substrate confers several advantages. In the following comparison, a 1,000 terminal class package is used.

Generally, a package area in an organic substrate (corresponding to partial area Rn) is at least 30 mm², and the substrate thickness is at least 2 mm. In an inorganic substrate such as a ceramic substrate, the area of the partial region Rn can be reduced by about 64% and the substrate thickness by about 78%. The size of an entire inorganic substrate such as a ceramic substrate is from 100 to 300 mm².

In addition, ceramic substrates have higher heat resistance and moisture resistance than an organic substrate, so more reliable electronic components can be obtained.

Warping of about 250 μm per 30 mm² occurs at high temperatures in organic substrates, but warping of 50 μm or less occurs at high temperatures in inorganic substrates.

However, even when a ceramic substrate is used, the variation in height of the conductive members (wiring 11, etc.) reaches at least about 10 μm when warping and the dimensional errors in conductive members during formation are taken into account.

Also, if an organic substrate has a certain degree of flexibility, the organic substrate becomes deformed when a mounted member is pressed strongly against the bonding substrate during the mounting process. As a result, the variation in height between conductive members (wiring 11, etc.) is reduced. Therefore, even when the protruding electrodes are thin, it is easier to bring the protruding electrodes into contact with both the conductive member and the external conductive member.

In contrast, when a mounted member is pressed against a bonding substrate consisting of a hard ceramic substrate or glass board during mounting, it is difficult to reduce the variation in height between conductive members (wiring 11, etc.). Therefore, when an inorganic substrate such as a ceramic substrate is used in the present embodiment, high connection reliability can be maintained by taking advantage of the characteristics of an inorganic substrate described above.

In particular, by making the height of the upper end of the bumps 15 from the upper surface of the substrate (a ceramic substrate 10 in the present embodiment) at least twice the height of the conductive member (wiring 11 in the present embodiment), variations in the height of the conductive members can be easily absorbed.

In the embodiment described above, the bumps are mound-shaped, but they do not have to be mound-shaped. Even when the top is a relatively flat plateau, the reliability of the electrical connection can be maintained after mounting due to deformation of the bumps during mounting.

Deformation of the bumps is preferably plastic deformation, but the present invention is not limited to plastic deformation and elastic deformation may be used. When elastic deformation is used, the reliability of the electrical connection can be maintained by the bonding strength of a securing material such as a non-conductive adhesive.

Second Embodiment

In the present embodiment, steps performed to manufacture the bump structures shown in FIG. 6 (c) or Fig. (d) will be described.

FIG. 7 (a) to FIG. 7 (e) are vertical cross-sectional views showing the steps performed to manufacture bumps in the second embodiment.

First, in the step shown in FIG. 7 (a), the bump core portions 15a are formed on a ceramic substrate 10 by performing screen printing with Ag paste over the regions including wiring 11 and the ceramic substrate 10 on both sides of the wiring. The method used to form the bump core portions 15a is described in the first embodiment.

Next, in the step shown in FIG. 7 (b), an initial resist film Re1 that is thicker than the bump core portions 15a is formed on the ceramic substrate 10. Then, in the step shown in FIG. 7 (c), the initial resist film Re1 is exposed to $O_2$ plasma to form a thin resist film Re2 that is thinner than the bump core portions 15a. At this time, only the tops of the mound-shaped bump core portions 15a protrude above the thinner resist film Re2.

Next, in the step shown in FIG. 7 (d), electroless plating is performed to form an intermediate plating layer 15c consisting of a Ni layer on the surface of the exposed tops of the bump core portions 15a. Here, electrolytic plating may be performed instead of electroless plating.

Then, in the step shown in FIG. 7 (e), after removing the thinned resist film Re2 using a resist stripping agent or exposure to $O_2$ plasma, electroless plating is performed to form a bump film 15b made of Au on the surface of the bump core portions 15a and the intermediate plating layer 15c. Here, electrolytic plating may be performed instead of electroless plating.

In other words, bumps 15 are formed by interposing the intermediate plating layer 15c between the bump core portion 15a and the bump film 15b only on the top.

In this way, the bumps 15 shown in FIG. 6 (c) are formed.

After the step shown in FIG. 7 (d), electroless plating using Au may be performed without removing the thinned resist film Re2 to form bump film 15b only on top of the intermediate plating layer 15c as indicated by the dotted lines in FIG. 7 (d). Here, bumps 15 with the structure shown in FIG. 6 (d) are obtained, and bump film 15b is not present in the region beyond the tops of the bump core portions 15a.

In the step shown in FIG. 7 (a), a non-conductive material such as an organic resin may be used alone to form the bump core portions 15a. Here, the nucleus of the electroless plating material has to be treated before performing the electroless plating.

Because electroless plating and electroless plating nucleation treatment are well-known in the art, a detailed description of these has been omitted.

When plating is performed, a resist pattern usually has to be formed that covers the non-plated regions. Because the resist pattern covering the non-plated regions has to be aligned with the pattern of the wiring 11 and bump core portions 15a, a photolithography step is required for the resist pattern.

In the method of the second embodiment by contrast, by printing mound-shaped bump core portions 15a and reducing the thickness of the initial resist pattern Re1 (by exposure to $O_2$ plasma in the present embodiment), the region to be subjected to electroless plating is exposed. In other words, this self-alignment action eliminates the need for a photolithography step, which simplifies the manufacturing process and reduces manufacturing costs.

Third Embodiment

A method for ensuring the smooth flow of adhesive during mounting of mounted members will now be described in the third embodiment.

FIG. 8 is a top view showing the pattern of the bumps 15 in the third embodiment from above.

In the present embodiment, as shown in the figure, the planar shape of the bumps 15 is established so that the dimension in the first direction x extending from the center to the periphery of the ceramic substrate 10 (substrate) is longer than the dimension in the second direction y extending orthogonal to the first direction x. Here, the first direction x is the longitudinal direction of the bumps 15. In addition to the elliptical shape shown in FIG. 8, the planar shape of the bumps 15 can be, for example, oval-shaped, rectangular, diamond-shaped, track-shaped, or irregularly shaped.

Dummy bumps 16 are also provided on the ceramic substrate 10 in addition to the bumps 15.

The present embodiment has the following effects.

When mounted members are mounted on a bonding substrate, an adhesive (a non-conductive adhesive 25 in the first embodiment) is applied as a bonding agent to the region Ra shown in FIG. 8, and the mounted members are placed in this region. At this time, the adhesive spreads naturally from region Ra to region Rb.

Because the dimension of the bumps 15 in the first direction x is longer than the dimension of the bumps 15 in the second direction y orthogonal to the first direction x in the present embodiment, fluidity of the adhesive is improved.

Also, as indicated by region Rb, the adhesive does not easily flow to the corners of the ceramic substrate 10 but bulges out on the sides. Therefore, in the present embodiment, dummy bumps 16 are provided on the sides to obstruct the flow of the adhesive and ensure that the adhesive flows as uniformly in each direction as possible. As a result, the present embodiment keeps the adhesive from oozing out on the sides.

In the present embodiment, the first direction x is the direction orthogonal to or parallel to each side of the rectangular ceramic substrate 10. However, the first direction x (longitudinal direction) may extend outward from the center point (in the radial direction). In other words, regardless of the shape of the ceramic substrate 10, the pattern may be such that the longitudinal direction of the bumps 15 is radial.

The arrangement in the present embodiment can conform readily to a normal wiring pattern, making for a smooth mounting process.

Fourth Embodiment

A method for transferring printing ink 15x to the ceramic substrate 10 in the step shown in FIG. 1 (b) will now be described in the fourth embodiment.

FIG. 14 is a vertical cross-sectional view showing the steps performed to manufacture a bonding substrate in the fourth embodiment. As in FIG. 1 (b), FIG. 14 shows a vertical cross-sectional structure of a portion of each partial region Rn in FIG. 1 (a).

In the present embodiment, as shown in FIG. 14, after a stencil 30 has been placed on the ceramic substrate 10, printing ink 15x is supplied on top of the stencil 30, and a squeegee 31 is moved from left to right in the figure to fill the openings 33 in the stencil 30 with printing ink 15x. The squeegee 31 also scrapes the printing ink from the stencil 30.

In this way, the printing ink 15x fills only in openings 33, and the printing ink 53 filling the openings is transferred to the ceramic substrate 10. The printing ink 53 filling the openings is then cured to form bumps 15 (or bump core portions 15a).

FIG. 15 is a graph showing an example of the particle size distribution of the conductive particles 15 in a printing ink 15x. In the present embodiment, the printing ink 15x contains a large number of conductive particles 51 and a resin binder 52 as the main components. The conductive particles 51 have the particle size distribution curve shown in FIG. 15. In the present embodiment, most of the conductive particles 51 are within a particle size distribution of about 0.1 μm or more and 20 μm or less. Among these conductive particles 51, the D50 particle size is 6.8 μm and D90 particle size is 14.8 μm.

FIG. 16 is a graph showing the relationship between the size of the openings 33 in a stencil 30 and the bump failure rate (non-conductivity rate) and bump height. In FIG. 16, the horizontal axis shows the dimension (μm) of the opening 33 in the stencil 30, the left vertical axis shows the defect rate (%) of the bumps 15, and the right vertical axis shows the bump height (μm). The bump height curve also shows the error range (variation) at each point. The bump failure rate indicates non-conductivity between the back side electrodes and bumps. The bump height is the height of the bumps 15 (or bump core portions 15a) after curing the printing ink 53 filling the openings. FIG. 16 shows the results of measurements of the bumps formed by transferring printing ink 15x with the particle size distribution shown in FIG. 15 to the ceramic substrate 10 using a stencil 30 with a thickness t of 30 μm.

In FIG. 16, the bump failure rate is about 62% when the opening dimension A is 20 μm. The bump failure rate decreases as the opening dimension A increases, so that the defect rate is about 6% when the opening dimension A is 30 μm and the defect rate is about 0% when the opening dimension A is 40 μm or more. This is probably due to the fact that when the opening dimension A is not large enough relative to the thickness t of the stencil 30 (for example, the opening dimension A is 30 μm or less), the conductive particles 51 remain in the openings 33 of the stencil and the printing ink 15x is not sufficiently transferred to the ceramic substrate 10. Therefore, it is believed that the opening dimension A in the stencil 30 is preferably at least four times the D50 size or at least two times the D90 size in the particle size distribution of the conductive particles 51. For example, in the results shown in FIG. 16, the opening dimension A of the stencil 30 would be about 5.8 times the D50 size of 6.8 μm (see FIG. 15) and about 2.7 times the D90 size of 14.8 μm (see FIG. 15).

Also, in FIG. 16, when the opening dimension A in the stencil 30 is in the range of about 40 μm or more and 60 μm or less, the error range for the bump height is about 5 μm or less. When the opening dimension A is approximately 70 μm or more, the variation in bump height increases sharply to 10 μm or more. This is probably due to the fact that the printing ink 15x filling the openings 33 is scraped away by the squeegee 31 when the opening dimension A in the stencil 30 is too large relative to the thickness t of the stencil 30, resulting in a large variation in the amount of printing ink 53 filling each opening and, by extension, the bump height. Therefore, it is believed that the opening dimension A in the stencil 30 is preferably at least about 1.2 times and no more than about 2.5 times the thickness t of the stencil.

It is also believed that the opening dimension A of the stencil 30 is preferably at least times the D50 particle size or no more than 5 times the D90 size of the conductive particles 51. For example, in the results shown in FIG. 16, the opening dimension A of the stencil 30 would be about 8.8 times the D50 size of 6.8 μm (see FIG. 15) and about 4.1 times the D90 size of 14.8 μm (see FIG. 15).

In the present embodiment, by properly controlling the opening dimension A of the stencil 30 relative to the particle size distribution of the conductive particles 51 and the thickness t of the stencil 30, a bonding substrate and electronic components can be provided that have an extremely low bump failure rate and a stable bump height.

The structures and manufacturing methods in the embodiments of the present invention disclosed herein are for explanatory purposes only, and the scope of the present invention is not limited to the scope of the description provided herein. The scope of the present invention is indicated by the scope of claims, and includes the scope of claims and all modifications equivalent in meaning within the scope of the claims.

The invention claimed is:

1. A method for manufacturing an electronic component, the method comprising:
   a step of preparing a bonding substrate on which a plurality of bumps are provided;
   a step of preparing a mounted member that has a plurality of external conductive members;
   a step of applying a fixing material to a surface of the bonding substrate on which the bumps have been formed and/or to a surface of the mounted member on which the external conductive members have been formed; and
   a step for pressing the bonding substrate against the mounted member such that the bumps and the external conductive members come into contact and fixing the bonding substrate and the mounted member with the fixing material,
   wherein the step of applying the fixing material comprises:
   a step of preparing as the fixing material a material containing a first base compound having a characteristic of viscosity which changes depending on the temperature and a second base compound having a characteristic of viscosity which changes depending on the temperature, the first base compound having a first viscosity at a first temperature, the first base compound having the lowest viscosity at the first temperature, the second base compound having a second viscosity at a second temperature higher than the first temperature, the second base compound having the lowest viscosity at the second temperature, and the fixing material having a viscosity higher than the first viscosity and the second viscosity at a third temperature lower than the first temperature, and having a characteristic of being cured at a fourth temperature higher than the second temperature; and
   a step of applying the fixing material to the bonding substrate and/or the mounted member at a temperature lower than the first temperature, and
   wherein the fixing step comprises:
   a step of pressing the bonding substrate against the mounted member when the temperature of the fixing material is lower than the first temperature; and
   a step of heating the fixing material to a temperature higher than the second temperature to cure the fixed material.

* * * * *